United States Patent [19]
Kasai

[11] Patent Number: 5,917,231
[45] Date of Patent: Jun. 29, 1999

[54] SEMICONDUCTOR DEVICE INCLUDING AN INSULATIVE LAYER HAVING A GAP

[75] Inventor: Nobuyuki Kasai, Tokyo, Japan

[73] Assignee: Mitsubishi Denki Kabushiki Kaisha, Tokyo, Japan

[21] Appl. No.: 08/890,213

[22] Filed: Jul. 9, 1997

[30] Foreign Application Priority Data

Feb. 17, 1997  [JP]  Japan .................................. 9-031858

[51] Int. Cl.$^6$ ........................................... H01L 23/58
[52] U.S. Cl. ...................... 257/633; 257/698; 257/774; 438/118
[58] Field of Search ........................ 257/632, 633, 257/698, 774; 438/114, 118, 122, 421

[56] References Cited

U.S. PATENT DOCUMENTS

| | | | |
|---|---|---|---|
| 4,062,040 | 12/1977 | Abbas et al. ............................. | 257/394 |
| 5,269,880 | 12/1993 | Jolly et al. .............................. | 156/643 |
| 5,373,190 | 12/1994 | Ichiyama ................................ | 257/737 |
| 5,521,436 | 5/1996 | Temple .................................. | 257/698 |

FOREIGN PATENT DOCUMENTS

| | | |
|---|---|---|
| 60-83350 | 5/1985 | Japan . |
| 352236 | 3/1991 | Japan . |
| 479333 | 3/1992 | Japan . |
| 4162532 | 6/1992 | Japan . |
| 4278543 | 10/1992 | Japan . |
| 6326055 | 11/1994 | Japan . |

*Primary Examiner*—Jerome Jackson, Jr.
*Assistant Examiner*—George C. Eckert, II
*Attorney, Agent, or Firm*—Leydig, Voit & Mayer

[57] ABSTRACT

A resin-encapsulated semiconductor device includes a semiconductor substrate having a surface including an insulating film and an electroplated transmission line. To avoid a possible separation and/or peeling of the insulating film with respect to the substrate, a gap is present between the insulating film and the plated line.

4 Claims, 7 Drawing Sheets

SEMICONDUCTOR DEVICE INCLUDING AN INSULATIVE LAYER HAVING A GAP

BACKGROUND OF THE INVENTION

1. Field of the Invention

The present invention generally relates to a method of making a semiconductor device and, more particularly, to a method of making a resin encapsulated semi conductor device that is designed to eliminate peeling and/or separation of an insulating layer which tends to occur adjacent and around an area where a circuit conductor is formed.

2. Description of the Prior Art

In a semiconductor device such as, for example, a GaAsMMIC, including a high power amplifier, a low-noise amplifier, an analog and/or digital circuit or the like, plating lines are often employed as a connecting conductor (an air-bridge interconnect or a cross-over conductor) between electrical component parts such as inductors, resistors, capacitors, internal matching circuits and/or bonding pads and also as a lead line for connecting a bonding pad with, for example, a terminal pin.

FIG. 8 illustrates schematically such a semiconductor device as viewed from the top. The illustrated semiconductor device comprises a semi-conductor chip 1 including a plurality of bonding pads 3 connected through connecting conductors 2 with circuit elements in an electrical circuit comprised of, for example, field-effect transistors, inductors, resistors and/or capacitors. A known version of this semiconductor device is shown in a cross-sectional representation in FIG. 9 taken along the line 1X—1X in FIG. 8 and is fabricated according to the sequence shown in FIGS. 10A to 10D. In the discussion that follows, reference will be made to a single bonding pad 3, situated in a pad area A, and an electrical connection between this bonding pad 3 and one of the field effect transistors situated in a FET area B.

In making the prior art semiconductor device shown in FIGS. 8 and 9, as far as the FET area B is concerned, an active layer 11 of the field effect transistor is formed on the semiconductor substrate 10 by an ion implantation technique as shown in FIG. 10A and, after ohmic electrodes 12 and gate electrodes 13 have been formed on the active layer 11, the field effect transistor is connected with active elements by means of transmission lines 20. After deposition of an insulating material on the semiconductor substrate 10 to form insulating films 40, a portion of each insulating film 40 is removed to provide contact areas 41.

On the other hand, as far as the pad area A is concerned, an insulating material is deposited on the semiconductor substrate 10 to form an insulating film 40, after a transmission line 20 has been deposited on the semiconductor substrate 10, to enhance bonding of the insulating film 40 with the semiconductor substrate 10, followed by removal of a portion of the insulating film 40 to provide a contact area 41.

Each of the contact areas 41 has an overlap structure wherein the associated insulating film 40 overlaps the transmission line 20 in a distance generally within the range of 0.5 to 2 μm.

Then, as shown in FIG. 10B, a first level photoresist layer 300 is formed over the insulating film 40 with local portions of the first level photoresist layer 300 removed in alignment with the respective contact areas 41 in a size larger than the opening of each contact area 41 and smaller than the width of the associated transmission line 20. After deposition of the first level photoresist layer 300, a conducting layer 30 is formed over the first level photoresist layer 300 by a sputtering technique.

After deposition of the conducting layer 30 over the first level photoresist layer 300, a second level photoresist layer 310 is formed over the first level photoresist layer 300 as shown in FIG. 10C, with local portions of the second level photoresist layer 310 removed in alignment with the respective contact areas 41 in a size larger than the corresponding depleted area in the first level photoresist layer 300, then aligned with the respective contact area 41.

Thereafter, as shown in FIG. 10D, the assembly is subjected to an electroforming process wherein an electrically conductive material such as, for example, Au is plated selectively only on portions of the conducting layer 30 which are exposed through respective openings in the second level photoresist layer 310 to form a plating layer 31, followed by removal of the photoresist layers 300 and 310 and the conducting layer 30 to leave a plating line 32 as shown in FIG. 9. The resultant assembly is finally resin encapsulated to complete the semiconductor device.

The semiconductor device so formed has the plating line 32 adjoining the insulating film 40 as shown in FIG. 9. Where the semiconductor chip is packaged by encapsulating it with an inexpensive resinous material, the adjacent insulating film 40 is needed to have a thickness not smaller than 1.5 μm to avoid any possible penetration of moisture into the semiconductor substrate through the resinous package. However, it has been found that the plating line 32 formed according to the prior art method generally has an internal stress tending to urge the adjacent insulating film 40 and, accordingly, the use of the increased thickness of the insulating film 40 results in increase of the area of contact between the plating line 32 and the insulating film 40. The increase of the area of contact between the plating line 32 and the insulating film 40 is problematic in that in the event that the amount of stresses transmitted from the plating line 32 to the insulating film 40 exceeds a critical value, the insulating film 40 tends to be peeled off and/or separate from the semiconductor substrate 10 as indicated by 4 in FIGS. 11A and 11B the latter figure being a cross-section of FIG. 11A taken along line XIB—XIB.

Since the areas of separation 4 of the insulating film generally occur between the semiconductor substrate 10 and the insulating film 40, not only are surface areas of the semiconductor substrate 10 exposed to the outside, but also the active elements disposed adjacent the areas of the separation 4 tend be adversely affected, accompanied by a reduction in operating characteristics and reliability of the electrical component parts.

SUMMARY OF THE INVENTION

Accordingly, the present invention has been devised to provide an improved method of making a resin-encapsulated semiconductor device wherein undesirable separation of the insulating film is minimized which would otherwise occur when a portion of the insulating film adjoining the plating line on a semiconductor substrate is urged by the effect of an internal stress built up in the plating line, which stress acting in a compressive direction.

As a result of intensive research conducted by the inventors of the present invention, it has been found that formation of a gap between the plating line and the insulating film is effective to lessen the internal stress built up in the plating line and, therefore, any possible separation and/or peel-off of the insulating film can be avoided by allowing the insulating film not to be pushed by the plating line.

Specifically, in order to accomplish the foregoing and other objects of the present invention, the present invention according to one aspect thereof provides a method of making a semiconductor device which comprises the steps of forming a water-impermeable insulating film of a relatively great thickness on a semiconductor substrate having at least a metal conductor, forming a first opening in the insulating film at a predetermined location above the metal conductor, forming a photoresist so as to overlay the insulating film and the first opening and forming Second opening in the photoresist in alignment with the first opening, forming an plating line so as to fill up the second opening, removing the photoresist to thereby form between the plating line and the insulating film a gap which will not press the insulating film, and encapsulating the semiconductor substrate to complete the semiconductor device.

In the resin-encapsulated semiconductor device the insulating film must necessarily have a relatively great thickness to avoid a possible penetration of water to the semiconductor substrate through the insulating film. On the other hand, since the plating line generally has a stress acting in a compressive direction, the use of the relatively great thickness of the insulating film adjoining the plating line would result in increase of the area of contact of the plating line with the insulating film and, therefore, a relatively large stress acts in a direction from the plating line to the insulating film to such an extent as to result in separation and/or peel-off of the insulating film.

With the method of the present invention, however, the gap is formed between the plating line and the insulating film and, therefore, generation of the stress acting which would be transmitted from the plating line to the insulating film so as to urge the later can be eliminated to thereby minimize the possibility of the insulating film being separated or peeled off from the semiconductor substrate.

Preferably, the first opening forming step includes a step of forming a gap in a portion of the insulating film held in contact with a surface of the semiconductor substrate adjacent the metal conductor. This is particularly advantageous in that even where depending on the pattern arrangement and/or the dimension requirements the insulating film must have at least a portion held in contact with the plating line, the gap can be formed in the insulating film to avoid the separation and/or peel-off of the insulating film.

The present invention according to another aspect thereof provides a method of making a semiconductor device which comprises the steps of forming a water-impermeable insulating film of a relatively great thickness on a semiconductor substrate having at least a metal conductor, forming a first opening in the insulating film at a predetermined location above the metal conductor, forming a gap in a portion of the insulating film held in contact with a surface of the semiconductor substrate adjacent the metal conductor, forming a photoresist so as to overlay the insulating film and the first opening and forming a second opening in the photoresist in alignment with the first opening, forming a plating line so as to fill up the second opening, removing the photoresist, and encapsulating the semiconductor substrate to complete the semiconductor device.

The method according to this another aspect of the present invention makes it possible to form the gap which renders the insulating film adjacent the metal conductor to be discontinuous and, accordingly, even when the stress is developed with which the plating line urges the insulating film, the stress will not be transmitted to an area of the insulating film which is held in contact with the surface of the semiconductor substrate and where the separation and/or peel-off tends to occur.

Again, the present invention according to a further aspect thereof provides a method of making a semiconductor device which comprises the steps of forming a water-impermeable insulating film of a relatively great thickness on a semiconductor substrate having at least a metal conductor, forming a first opening in the insulating film at a predetermined location above the metal conductor by removing a corresponding portion of the insulating film so as to render a peripheral edge of that portion of the insulating film, which is left by forming the first opening, to represent a generally tapered shape having an area of section progressively decreasing towards a bottom of the first opening, forming a photoresist so as to overlay the insulating film and the first opening and forming a second opening in the photoresist in alignment with the first opening, forming a plating line so as to fill up the second opening, removing the photoresist and forming the plating line on a tapering peripheral edge of that portion of the insulating film, and encapsulating the semiconductor substrate to complete the semiconductor device.

With this method in which the insulating film has the tapered opening, the stress which has hitherto acted from the plating line in a direction substantially perpendicular to the semiconductor substrate can be lessened by the peripheral side edge of the insulating film defining the first opening and, therefore, the stress on the insulating film be lessened to eliminate the possible separation and/or peel-off of the insulating film.

Preferably, the first opening forming step includes a step of forming a gap in a portion of the insulating film held in contact with a surface of the semiconductor substrate adjacent the metal conductor. This is particularly advantageous in that even where depending on the pattern arrangement and/or the dimension requirements the insulating film must have at least a portion held in contact with the plating line, the gap can be formed in the insulating film to avoid the separation and/or peel-off of the insulating film.

The present invention also provides a semiconductor device which comprises a semiconductor substrate having at least a metal conductor, a water-impermeable insulating film of a relatively great thickness formed on the semiconductor substrate so as to overlay the metal conductor, a plating line embedded in an opening formed in the insulating film at a predetermined location above the metal conductor, a gap formed in a portion of the insulating film held in contact with a surface of the semiconductor substrate adjacent the metal conductor to thereby prevent the plating line to urge the insulating film, and a resin enclosing the semiconductor substrate to complete the semiconductor device.

The present invention further provides a semiconductor device which comprises a semiconductor substrate having at least a metal conductor, a water-impermeable insulating film of a relatively great thickness formed on the semiconductor substrate so as to overlay the metal conductor, a plating line embedded in an opening formed in the insulating film at a predetermined location above the metal conductor, said opening having a peripheral edge having an area of section progressively decreasing towards a bottom of such opening, a resin enclosing the semiconductor substrate to complete the semiconductor device.

BRIEF DESCRIPTION OF THE DRAWINGS

The present invention will become readily understood from the following description of preferred embodiments thereof made with reference to the accompanying drawings, in which like parts are designated by like reference numerals and in which.

DETAILED DESCRIPTION OF THE EMBODIMENTS

First Embodiment

A plating line structure of a semiconductor device formed according to a first preferred embodiment of the present invention and a method of making the same are shown in FIGS. 1 and 2A to 2D, respectively.

Figure 2A:
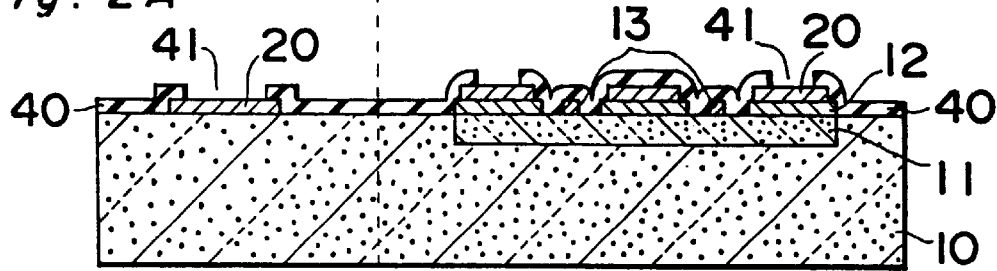
FIGS. 2A to 2D illustrate the sequence of process steps of making the semiconductor device shown in FIG. 1.

In making a semiconductor device according to the first embodiment of the present invention, as far as the FET area B is concerned, as shown in FIG. 2A, an active layer 11 of the field effect transistor is formed on the semiconductor substrate 10 by an ion implantation technique and, after ohmic electrodes 12 and gate electrodes 13 have been formed on the active layer 11, the field effect transistor is connected with active elements by means of transmission lines 20 which may be made of Ti and/or Au. After deposition of an insulating material on the semiconductor substrate 10 to form insulating films 40 of a relatively large thickness, for example, about 1.5 $\mu$m, a portion of each insulating film 40 is removed to provide contact areas 41.

On the other hand, as far as the pad area A is concerned, still referring to FIG. 2A, an insulating material is deposited on the semiconductor substrate 10 to form an insulating film 40 after the transmission line 20 has been deposited on the semiconductor substrate 10, to enhance bonding of the insulating film 40 with the semiconductor substrate 10, followed by removal of a portion of the insulating film 40 to provide a contact area 41.

Each of the contact areas 41 has an overlap structure wherein the associated insulating film 40 overlaps the transmission line 20 by a distance generally within the range of 0.5 to 2 $\mu$m.

Figure 2B:
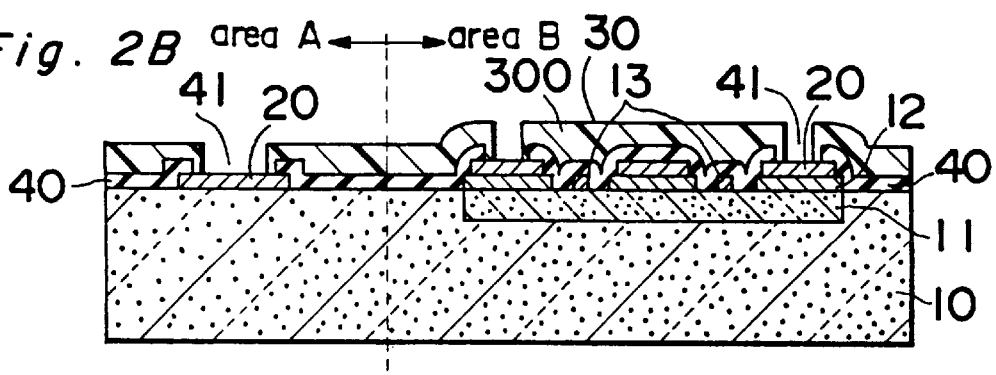

Then, as shown in FIG. 2B, a first level photoresist layer 300 is formed over the insulating film 40 with local portions of the first level photoresist layer 300 removed in alignment with the respective contact areas 41 in a size smaller than the opening of each contact area 41. In such a case, the resultant opening in each local portion of the first level photoresist layer 300 has a width preferably smaller by 0.2 to 2 $\mu$m on each side than the width of the associated contact area 41.

After deposition of the first level photoresist layer 300, a conducting layer 30, which may be made of Ti and/or Au, is formed over the first level photoresist layer 300 and also regions aligned with the contact areas 41 by a sputtering technique.

Figure 2C:
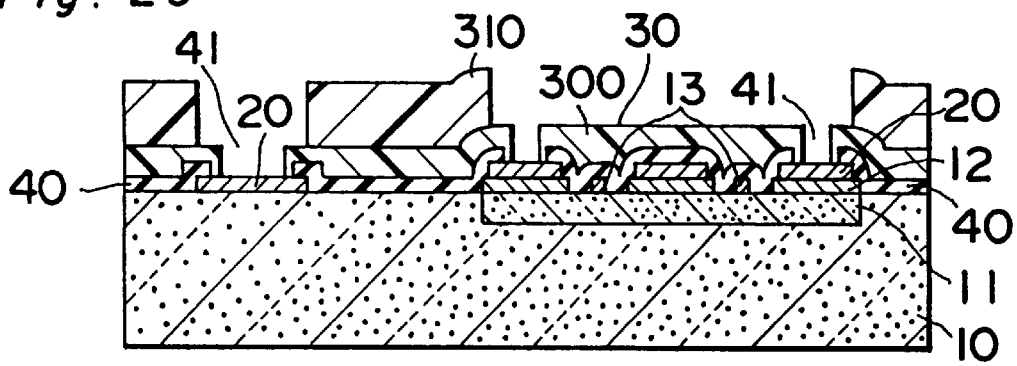

As shown in FIG. 2C, a second level photoresist layer 310 is subsequently formed over the first level photoresist layer 300 with local portions of the second level photoresist layer 310 removed in alignment with the respective contact areas 41 in a size larger than the corresponding removed area in the first level photoresist layer 300 then aligned with the respective contact area 41.

Figure 2D:
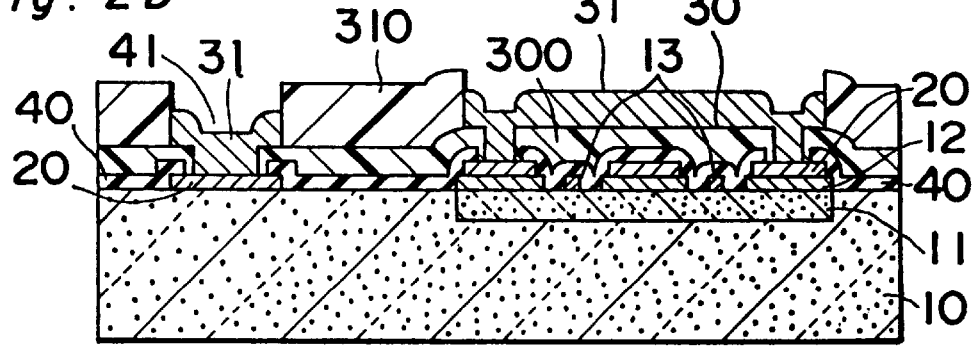

Thereafter, as shown in FIG. 2D, the assembly is subjected to an electroforming process wherein an electrically conductive material such as, for example, Au is electroplated selectively only on portions of the conducting layer 30 which are exposed to the outside through respective openings in the second level photoresist layer 310 to form a plated layer 31 which fills each opening in the second level photoresist layer 310. Thus, since the plating layer 31 fills the openings in the second level photoresist layer 310, the internal stress built up in the plating layer 31 is relatively large as compared with the case wherein the plating line is thin and may therefore constitute a cause of separation of the insulating layer 40 formed adjacent the plating layer 31.

Figure 1:
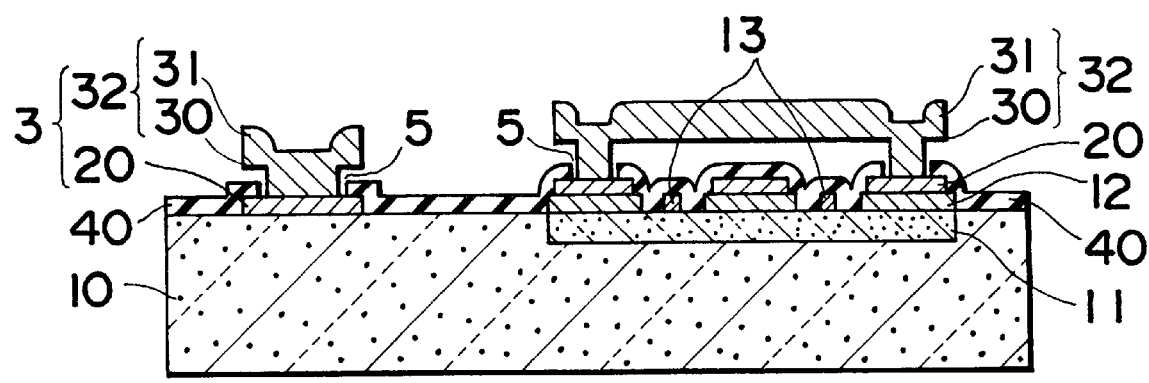
FIG. 1 is a schematic cross-sectional view of a semiconductor device having plating lines formed in accordance with a method of making a semiconductor device according to a first embodiment of the present invention.

Finally, the photoresist layers 300 and 310 and the conducting layer 30 are completely removed to thereby leave a plating line 32 as shown in FIG. 1. The resultant assembly is finally resin-encapsulated to complete the semiconductor device.

With this semiconductor device making method described, as shown in FIG. 1, the plating line 32 does not contact the insulating film 40 and a gap of about 0.5 to 2 $\mu$m is formed between the plating line 32 and the insulating film 40 as indicated by 5. Accordingly, no stress is built up in the plating line 32 which would otherwise push on the insulating film 40 then held in contact therewith and, therefore, the possibility of the insulating film 40 being separated and/or peeled off from the substrate 10, which has often been found when the insulating film has a relatively large thickness, can be avoided.

It is to be noted that although in the foregoing embodiment of the present invention and also the embodiments of the present invention reference is made to the formation of the plating line 32 in the pad area A, a similar description can equally apply to any other area of the substrate where other active elements are formed.

Second Embodiment

Figure 3:
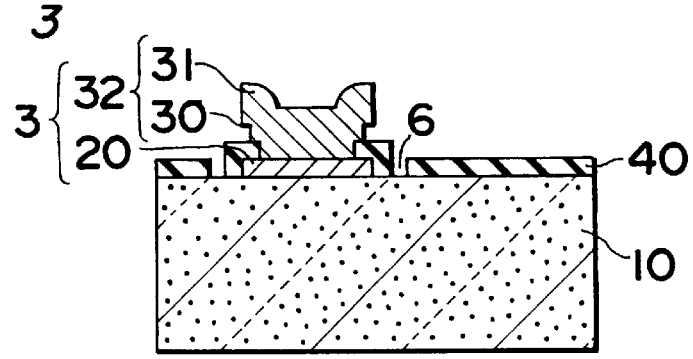
FIG. 3 is a fragmentary sectional view showing a pad area of the semiconductor device where the plating line is formed by the method according to an alternative embodiment of the present invention.

The plating line 32 formed on the pad area of the substrate by the method according to a second embodiment of the present invention is shown in FIG. 3. In the structure shown therein, a gap 6 of a width within the range of 1 to 3 $\mu$m is formed in a portion of the insulating film 40 on the semiconductor substrate 10 adjacent the plating line 32.

Figure 11A:
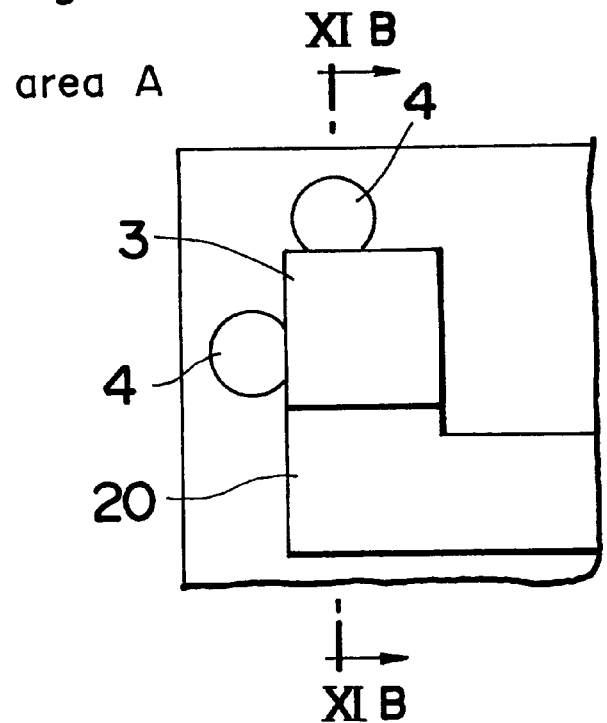
FIG. 11A is a schematic diagram of a portion of a semiconductor device showing how the insulating film is separated from the substrate.
Figure 11B:
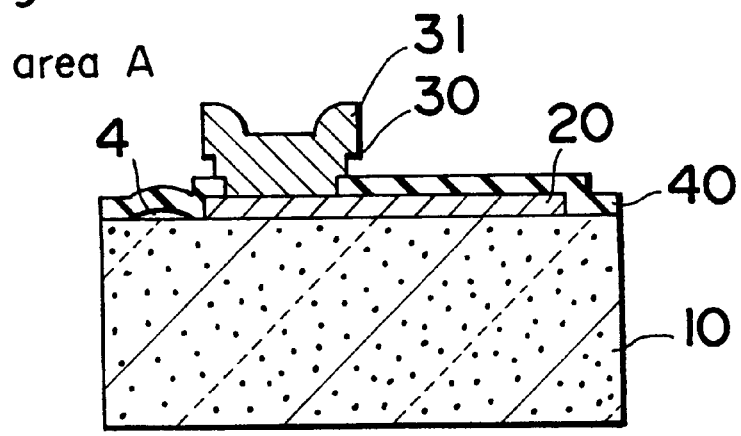
FIG. 11B is a schematic cross-sectional view showing the presence of an area of separation of the insulating film relative to the substrate.

The separation of the insulating film 40, which takes place when urged by the plating layer 31, tends to occur at a flat portion of the insulating film 40 adjacent the plating line 32 as shown in FIG. 11B. The gap 6 is defined at an area where stress concentration occurs and, therefore, any possible stress concentration at the flat portion of the insulating film 40 can be avoided to minimize separation and/or peeling of the insulating film 40.

Figure 10A:
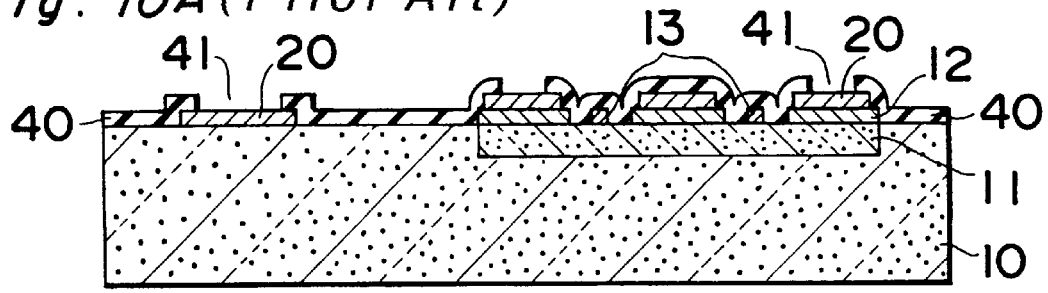
FIGS. 10A to 10D illustrate the sequence of process steps of the prior art method of making the semiconductor device of FIG. 8.

The structure shown in FIG. 3 can be obtained when, during execution of the step shown in FIG. 10A of the prior art method in which the contact area 41 is formed by etching and removing a portion of the insulating film 40, a portion of the insulating film 40 where the gap 6 is to be eventually formed is simultaneously etched and removed.

Third Embodiment

Figure 4:
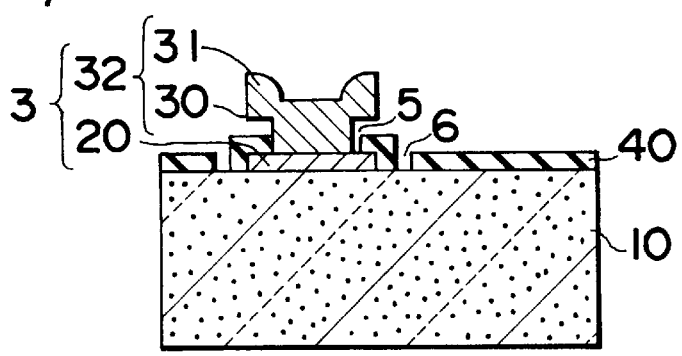
FIGS. 4, 5, 6, and 7 are views similar to FIG. 3, showing the method according to third to sixth embodiments of the present invention, respectively.

The plating line 32 formed on the pad area of the substrate by the method according to a third embodiment of the present invention is shown in FIG. 4. The structure shown in FIG. 4 is designed to have concurrently the respective features of the first and second embodiments of the present invention. More specifically, in the structure shown in FIG. 4, not only is the gap of 0.5 to 2 μm formed between the plating line 32 and the insulating film 40, but also the gap 6 of 1 to 3 μm in width is formed in that portion of the insulating film 40 on the semiconductor substrate 10.

While in the structure of the plating line according to the first embodiment of the present invention it is highly effective to provide the gap 5 in all directions around the plating line 32, it may however occur that at least a portion of the plating line 32 (for example, a left side portion of the plating line 32 as shown in FIG. 4) must be held in contact with the insulating film 40 depending on the specific layout and/or dimensions of the pattern. In such a case, the provision of the gap 6 so formed in the insulating film 40 as described in connection with the second embodiment of the present invention is effective to minimize separation and/or peel-off of the insulating film 40.

The structure shown in FIG. 4 can be obtained when, during execution of the step shown in FIG. 2A of the method described in connection with the first embodiment of the present invention, the insulating film 40 has to be etched and removed to define the gap 6, followed sequentially by the steps shown respectively in FIGS. 2B to 2D.

Fourth Embodiment

Figure 5:
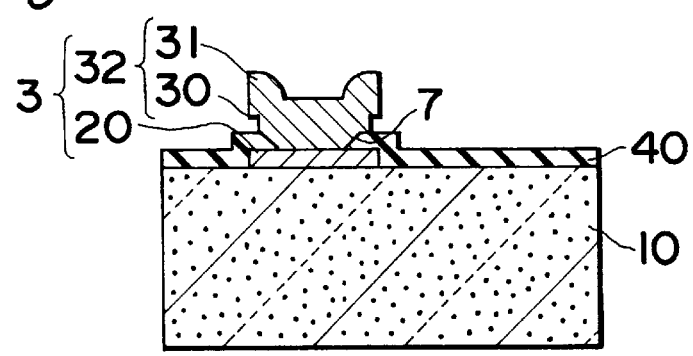
Figure 9:
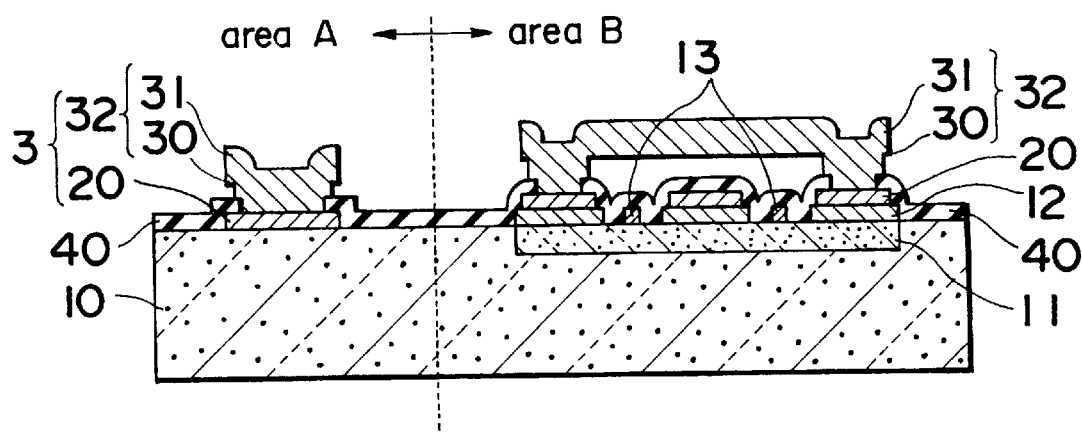
FIG. 9 is a schematic cross-sectional view of the semiconductor device of FIG. 8 made by the prior art method.

The plating line 32 formed on the pad area of the substrate by the method according to a fourth embodiment of the present invention is shown in FIG. 5. The structure shown in FIG. 5 is designed so that while in the prior art structure shown a portion of contact of the plating layer 31 with the insulating film 40 at the contact area 41 is formed so as to lie perpendicular to the semiconductor substrate 10 as shown in FIG. 9, that portion of the insulating film 40 which is in contact with the plating line 32 is tapered at 7 at a predetermined tapering angle as shown in FIG. 5. The tapering reduces the stress with which the plating line 32 may urge the insulating film 40 laterally along the semiconductor substrate 10.

Since, as described above that portion of the insulating film 40 that is held in contact with the plating line 32 is tapered at 7, a portion of the stress built up in the plating layer 31 and acting to urge the insulating film 40 laterally, can be laterally outwardly dissipated particularly at a region above the tapered portion 7 of the insulating film 40 without being accompanied by separation of the insulating film 40, to thereby prevent the insulating film 40 from being separated under the influence of the stress built up in the plating line 32.

Particularly where the contact area 41 has an opening of not greater than 5 μm, formation of the gap 5 of 0.5 to 2 μm in width such as in the first embodiment of the present invention would require a connection between the plating layer 31 and the underlying metal transmission line 20 to be 1 to 4 μm in dimension, accompanied by reduction in connecting strength. In contrast thereto, the use of the tapered feature 7, such as in the fourth embodiment of the present invention, is effective to allow the connecting dimension to be maintained as usual thereby avoiding any possible reduction in connecting strength.

The structure shown in FIG. 5 can be attained when, during execution of the step shown in FIG. 10A of the prior art method, wherein the insulating film 40 is etched and removed to form the contact area 41, while a resist pattern (not shown) is masked, the insulating film 40 is and removing using an isotropic etching technique. For example, wet etching may be used form the tapered feature 7 in the insulating film 40. Thereafter, the method steps shown respectively in FIGS. 2B to 2D are to be followed to complete the semiconductor device.

It is to be noted that the etching to form the tapered feature 7 may be produced not only by the wet etching process, but also a dry etching process in which appropriate etching conditions are selected.

Fifth Embodiment

Figure 6:
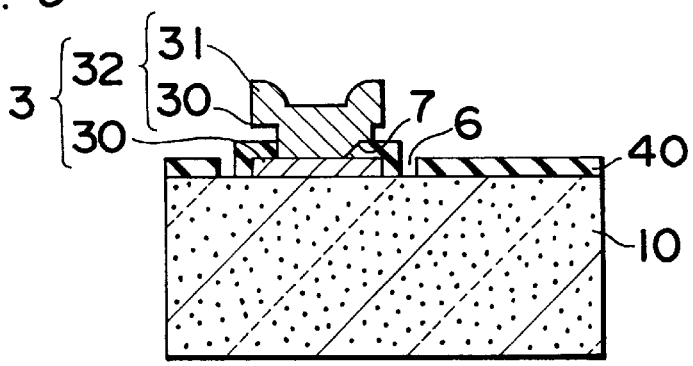

The plating line 32 formed on the pad area of the substrate by the method according to a fifth embodiment of the present invention is shown in FIG. 6. The structure shown in FIG. 6 is designed to have concurrently the respective features of the second and fourth embodiments of the present invention. More specifically, in the structure shown in FIG. 6, not only is the gap 6 formed between the plating line 32 and the insulating film 40, but also that portion of the insulating film 40 which is held in contact with the plating line 32 has the tapered feature 7.

It is most effective to provide the tapered feature 7 such as in the fifth embodiment of the present invention in all directions around the plating line 32, it may, however, occur that particularly where the insulating film 40 has an opening of a width not greater than 5 μm, only a portion of the peripheral lip region of the insulating film 40 around the opening (for example, a left side portion of the plating line 32 shown in FIG. 6) can be tapered to secure a sufficient strength of connection between the plating line 32 and the metal transmission line 20. In such case, the gap 6 such as discussed in connection with the second embodiment of the present invention has to be formed in the insulating film 40 to avoid any possible separation of the insulating film 40 relative to the semiconductor substrate 10.

Figure 10B:
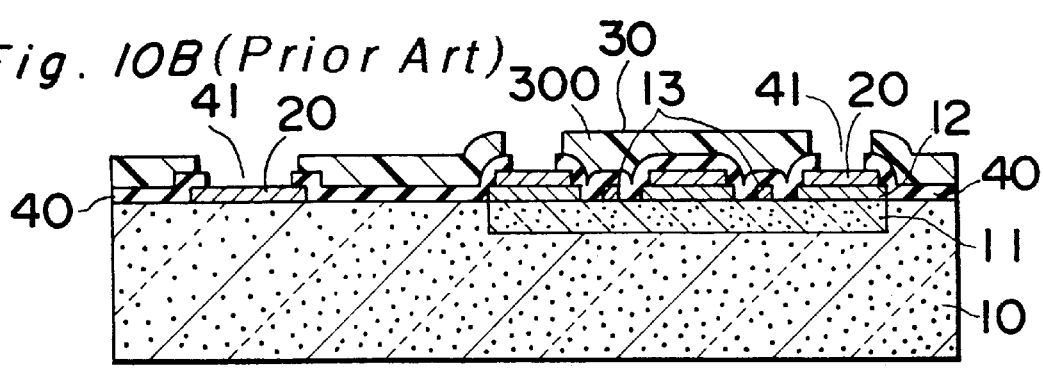
Figure 10C:
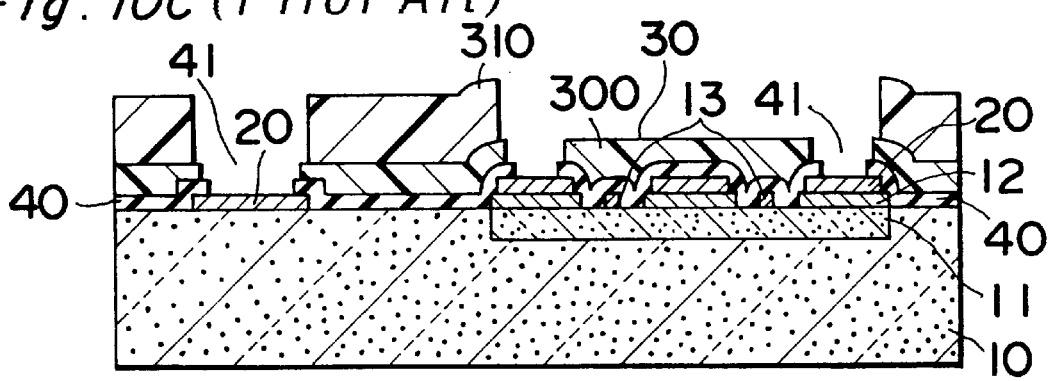
Figure 10D:
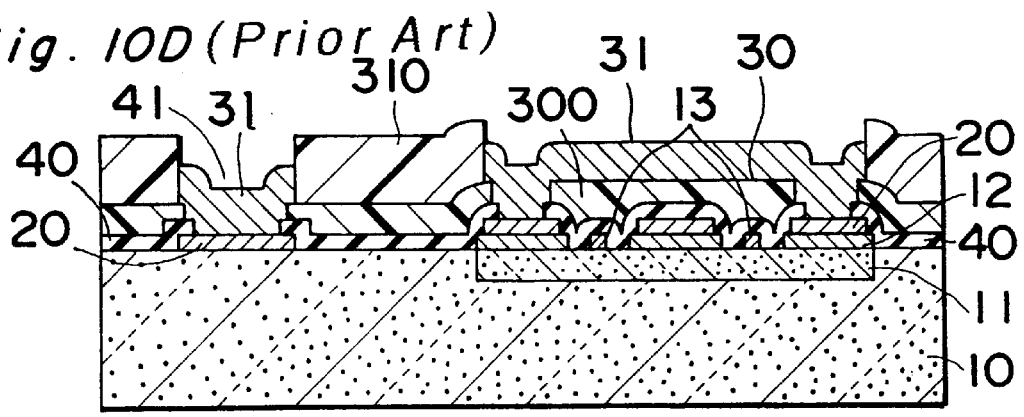

The structure shown in FIG. 6 can be obtained when during execution of the process step shown in FIG. 10A of the prior art method and after a portion of the insulating film 40, while masked by a first resist mask, (not shown) has been removed by etching, by an isotropic etching technique, such as, for example, wet etching. The technique to causes a portion of the peripheral lip region of the insulating film 40 around the opening to be tapered as at 7, a portion of the tapered feature 7 in the insulating film 40 (for example, a left portion laterally of the plating line 32 shown in FIG. 6) and another portion of the insulating film 40 which would eventually form the gap 6 are etched and removed by the use of a second resist mask (not shown). Thereafter, the method steps shown respectively in FIGS. 10B to 10D are followed to complete the semiconductor device.

Sixth Embodiment

Figure 7:
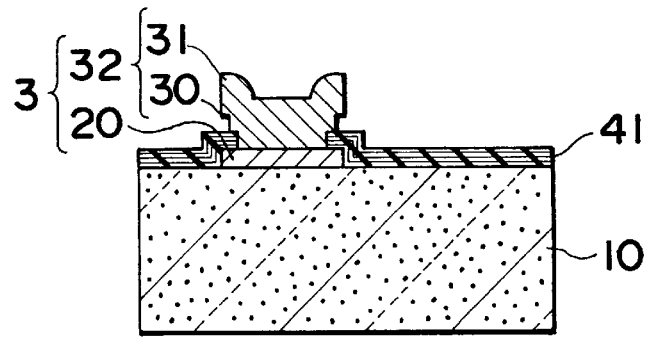
Figure 8:
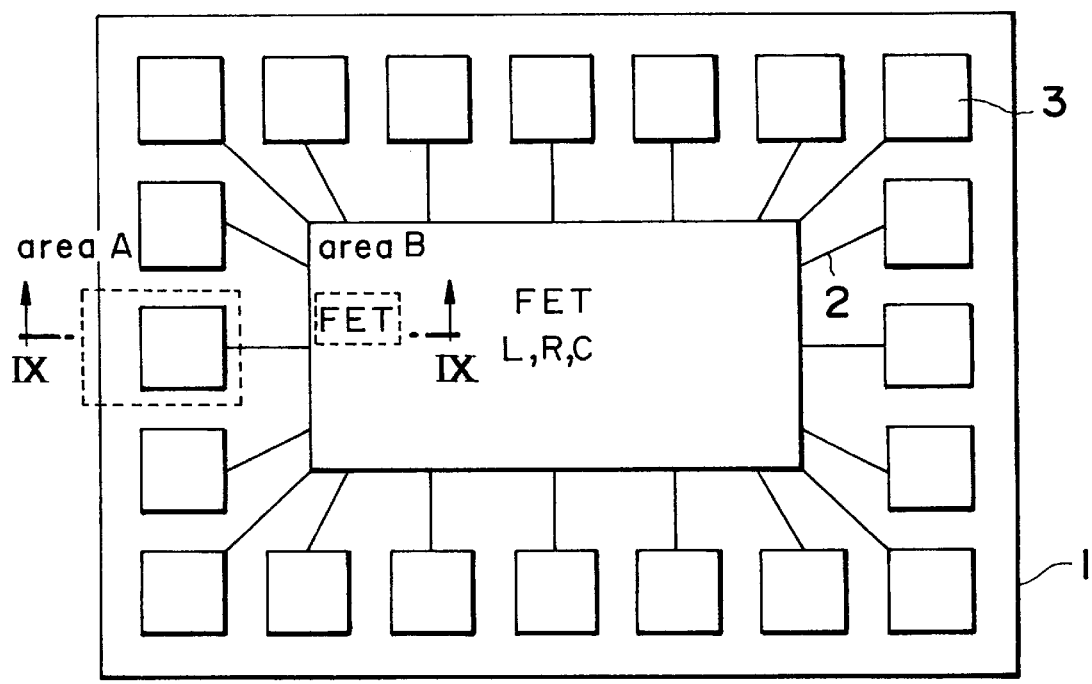
FIG. 8 is a schematic top plan view showing an example of a semiconductor device.

The plating line 32 formed on the pad area of the substrate by the method according to a sixth embodiment of the present invention is shown in FIG. 7. In the structure shown in FIG. 7, the insulating film 40 is in the form of a multi-layered film 41 including two or more films made of one or a mixture of SiN, SiO, and SiON.

According to this embodiment, depending on the film forming method employed and film forming conditions employed, each of the layers forming the multi-layered insulating film 41 can have either a compressive stress or a tensile stress as tabulated in the following table.

| Film Forming Method | Film Material | Stress (dyn/cm$^2$) |
| --- | --- | --- |
| P-CVD (Batch System) | SiO | +3 to 4 × 10$^9$ |
|  | SiN | +5 × 10$^9$ |
|  | SiN | +2 × 10$^{10}$ |
|  | (Low Leak) |  |
|  | SiON | +2 × 10$^{10}$ |
| P-CVD (C to C System) | SiO | +1 × 10$^9$ |
|  | SiN* | −2 × 10$^9$ |
|  | SiN** | +1 × 10$^{10}$ |

Note that the plus (+) sign represents the compressive stress and the minus (−) sign represents the tensile strength. Also, * and ** represent whether the SiN layer is prepared by the use of a mixture SiH$_4$ and NH$_3$ or the SiN layer prepared by the use of a mixture of a SiH$_4$, NH$_3$ and N$_2$, respectively.

Accordingly, since the use of the multi-layered insulating film 41 is effective to control the internal stress of the insulating film 41 as a whole, it is possible to adjust the internal stress of the insulating film 41 so as to push back the compressive stress acting on the insulating film 41 to lessen the stress transmitted from the plating line 32 to the insulating film 41, resulting in minimization of a possible separation of the insulating film 41.

The structure shown in FIG. 7 can be obtained when, during execution of the process step shown in FIG. 10A of the prior art method, the individual layers, which eventually form the multi-layered insulating film 41, have to be sequentially deposited one on the other to complete the multi-layered insulating film 41. Thereafter, process steps similar to those in the prior art method are sequentially followed to complete the semiconductor device.

In any event, the method and the structure according to the sixth embodiment of the present invention may be combined with those according to any one of the first to sixth embodiments of the present invention, if desired.

As hereinbefore fully described, the present invention makes it possible to form the plating line in which the stress with which the plating line urges the insulating film as a result of the internal stress built up in the plating line is not generated. Specifically, in the resin-encapsulated semiconductor device in which the use is necessitated of an insulating film of a relatively large thickness, separation and/or peel-off of the insulating film, which tend to occur as a result of the above described stress, can advantageously be avoided to increase the reliability of the element.

Also, the presence of the gap in the insulating film adjacent the metal conductor renders the insulating film discontinuous and, therefore, even when the stress is generated in a direction in which the plating line urges the insulating film, the stress will not be transmitted to an area of the insulating film held in contact with the surface of the semiconductor substrate where the film separation tends to occur, to thereby prevent the insulating film from being separated.

Yet, since that portion of the insulating film which is held in contact with the plating line is tapered, a portion of the stress with which the plating line urges the insulating film can be laterally outwardly dissipated particularly at a region above the tapered portion of the insulating film without being accompanied by separation of the insulating film, preventing the insulating film from being separated.

Where the various structures described hereinbefore are combined, the result would exhibit a combination of those features brought about by the individual structures.

Although the present invention has been described in connection with the preferred embodiments, it should be noted that various changes and modifications are apparent to those skilled in the art. Accordingly, such changes and modifications so far as encompassed by the appended claims are to be understood as included within the scope of the present invention.

What is claimed is:

1. A semiconductor device comprising:

a semiconductor substrate having a surface on which a metal transmission line is disposed;

a water-impermeable insulating film having a relatively large thickness, disposed on the surface of the semiconductor substrate, and covering a first part of the metal transmission line, a second part of the metal transmission line not being covered by the insulating film; and a plated line disposed in an opening in the insulating film that exposes the second part of the metal transmission line, in contact with the metal transmission line in the opening, wherein the insulating film includes a gap extending to the surface of the semiconductor substrate and spaced from the metal transmission line, preventing the plated line, pressing against the insulating film, from dislodging the insulating film.

2. The semiconductor device according to claim 1 wherein the insulating film contacts the plated line at the opening.

3. The semiconductor device according to claim 1 wherein the insulating film does not contact the plated line at at least part of the opening.

4. A semiconductor device comprising:

a semiconductor substrate having a surface on which a metal transmission line is disposed;

a water-impermeable insulating film having a relatively large thickness, disposed on the surface of the semiconductor substrate, and covering a first part of the metal transmission line, a second part of the metal transmission line not being covered by the insulating film; and a plated line disposed in an opening in the insulating film that exposes the second part of the metal transmission line, in contact with the metal transmission line, wherein the opening includes at least one surface of the insulating film that is oblique to the surface of the semiconductor substrate, the plated line contacts the oblique surface and extends beyond the oblique surface on the insulating film, preventing the plated line, pressing against the insulating film, from dislodging the insulating film, the insulating film including a gap extending to the surface of the semiconductor substrate and spaced from the metal transmission line.

* * * * *